United States Patent
Hikichi et al.

(10) Patent No.: US 9,523,743 B2
(45) Date of Patent: Dec. 20, 2016

(54) MAGNETIC SENSOR CAPABLE OF IDENTIFYING AN INDIVIDUAL HAVING A HIGH OFFSET VOLTAGE

(71) Applicant: Seiko Instruments Inc., Chiba-shi, Chiba (JP)

(72) Inventors: Tomoki Hikichi, Chiba (JP); Minoru Ariyama, Chiba (JP)

(73) Assignee: SII Semiconductor Corporation (JP)

( * ) Notice: Subject to any disclaimer, the term of this patent is extended or adjusted under 35 U.S.C. 154(b) by 132 days.

(21) Appl. No.: 14/560,806

(22) Filed: Dec. 4, 2014

(65) Prior Publication Data

US 2015/0084620 A1    Mar. 26, 2015

Related U.S. Application Data

(63) Continuation of application No. PCT/JP2013/060882, filed on Apr. 11, 2013.

(30) Foreign Application Priority Data

Jun. 7, 2012    (JP) .................... 2012-130161

(51) Int. Cl.
*G01R 33/07* (2006.01)
*G01R 33/00* (2006.01)

(52) U.S. Cl.
CPC ....... *G01R 33/0088* (2013.01); *G01R 33/0023* (2013.01); *G01R 33/072* (2013.01)

(58) Field of Classification Search
CPC ............ G01R 33/0023; G01R 33/0088; G01R 33/072
USPC .......................... 324/207.2, 251, 225, 207.12
See application file for complete search history.

(56) References Cited

U.S. PATENT DOCUMENTS

| | | | | |
|---|---|---|---|---|
| 5,406,202 A | * | 4/1995 | Mehrgardt | G01R 33/07 324/225 |
| 2008/0197834 A1 | * | 8/2008 | Takeda | G01R 1/30 324/123 R |
| 2010/0117640 A1 | * | 5/2010 | Sugiura | G01R 33/07 324/251 |
| 2010/0308801 A1 | * | 12/2010 | Ogawa | G01B 7/003 324/207.2 |

(Continued)

FOREIGN PATENT DOCUMENTS

| | | |
|---|---|---|
| JP | 2004-37221 A | 2/2004 |
| JP | 2008-236737 A | 10/2008 |
| JP | 2010-281764 A | 12/2010 |

OTHER PUBLICATIONS

English Translation of International Search Report for PCT/JP2013/060882 dated Jul. 3, 2013, 1 page.

*Primary Examiner* — Jay Patidar
(74) *Attorney, Agent, or Firm* — Brinks Gilson & Lione

(57) ABSTRACT

Provided is a magnetic sensor capable of identifying an individual having a high offset voltage, which is a cause of an initial defect in magnetic characteristics, and changes over time. A cross-transmission switch is provided in a changeover switch circuit which transmits to an amplifier circuit a differential signal voltage output from a Hall element, and the cross-transmission switch cross-transmits a signal in any one of a first period and a second period during which a current flowing into the Hall element is switched by a control signal from a control circuit, to thereby determine and identify a magnitude of an offset voltage.

4 Claims, 4 Drawing Sheets

(56) References Cited

U.S. PATENT DOCUMENTS

2011/0074404 A1* 3/2011 Hikichi ............... G01R 33/072
                                                              324/251
2012/0153945 A1* 6/2012 Ezekwe ............. G01R 33/0023
                                                              324/251

* cited by examiner

MAGNETIC SENSOR CAPABLE OF IDENTIFYING AN INDIVIDUAL HAVING A HIGH OFFSET VOLTAGE

RELATED APPLICATIONS

This application is a continuation of PCT/JP2013/060882 filed on Apr. 11, 2013, which claims priority to Japanese Application No. 2012-130161 filed on Jun. 7, 2012. The entire contents of these applications are incorporated herein by reference.

BACKGROUND OF THE INVENTION

1. Field of the Invention

The present invention relates to a magnetic sensor using a Hall element on a semiconductor substrate, and more particularly, to a characteristic abnormality detection circuit for the magnetic sensor.

2. Description of the Related Art

A magnetic sensor is widely used for detecting a movement or a rotation of various movable objects. For example, the magnetic sensor is used to detect opening and closing of a mobile phone, or to detect the rpm of a motor. In recent years, there is used a Hall element formed on a Si substrate, which is inexpensive but has low sensitivity and a high offset voltage. Then, offset voltages of the Hall element and an amplifier are cancelled by signal processing, to thereby realize a magnetic sensor which is inexpensive and has high magnetic detection precision.

FIG. 4 is a block diagram of a conventional magnetic sensor. A conventional magnetic sensor 10 includes a Hall element 2, a changeover switch circuit 30, an amplifier 4, a sampling circuit 5, a reference voltage circuit 60, a comparator 7, and an output circuit 8. The conventional magnetic sensor 10 operates as follows in order to cancel the offset voltage. The changeover switch circuit 30 switches current paths between respective two terminals on a diagonal line of the Hall element 2 in a complementary manner between a first period and a second period. The output voltage is amplified by the amplifier 4, and is held in a time division manner and averaged by the sampling circuit 5. The reference voltage circuit 60 outputs a reference voltage Vref. The comparator 7 compares the voltage held in the sampling circuit 5 and the reference voltage Vref, and determines the intensity of the magnetic field. The magnetic sensor 10 outputs the determination result via the output circuit 8, thereby outputting a detection signal corresponding to the magnetic field. The conventional magnetic sensor 10 operates as described above, and cancels the offset voltages of the Hall element and the amplifier by signal processing.

However, when Si is used as a material for the Hall element 2, the offset voltage is higher by several digits than a magnetic field signal voltage. There has been a problem in that, when the offset voltage is high, the offset voltage is not cancelled mainly due to saturation of the output voltage of the amplifier 4, and magnetic characteristics significantly deteriorate.

SUMMARY OF THE INVENTION

The present invention has been made in order to solve the above-mentioned problem, and provides an inexpensive high-precision magnetic sensor with magnetic characteristics.

In order to solve the conventional problem, a magnetic sensor according to an exemplary embodiment of the present invention has the following configuration.

The magnetic sensor includes a changeover switch circuit which causes a current to flow into a first terminal pair of a Hall element and inputs a first differential signal voltage from a second terminal pair thereof during a first period, and which causes a current to flow into the second terminal pair and inputs a second differential signal voltage from the first terminal pair during a second period. The changeover switch circuit includes series-transmission switches and cross-transmission switches, the series-transmission switches and the cross-transmission switches being provided in series between terminals of the Hall element and output terminals of the changeover switch circuit. The cross-transmission switch is controlled to determine a magnitude of an offset voltage of the Hall element.

According to the magnetic sensor of the present invention, only by adding a simple circuit, the voltage based on the offset voltages of the Hall element and an amplifier circuit is evaluated. Therefore, an individual having a high offset voltage is identified by binary decision in an inspection process, and hence there is an effect of improving quality of a product.

DETAILED DESCRIPTION OF THE PREFERRED EMBODIMENT

In the following, an embodiment of the present invention is described with reference to the attached drawings.

Figure 1:
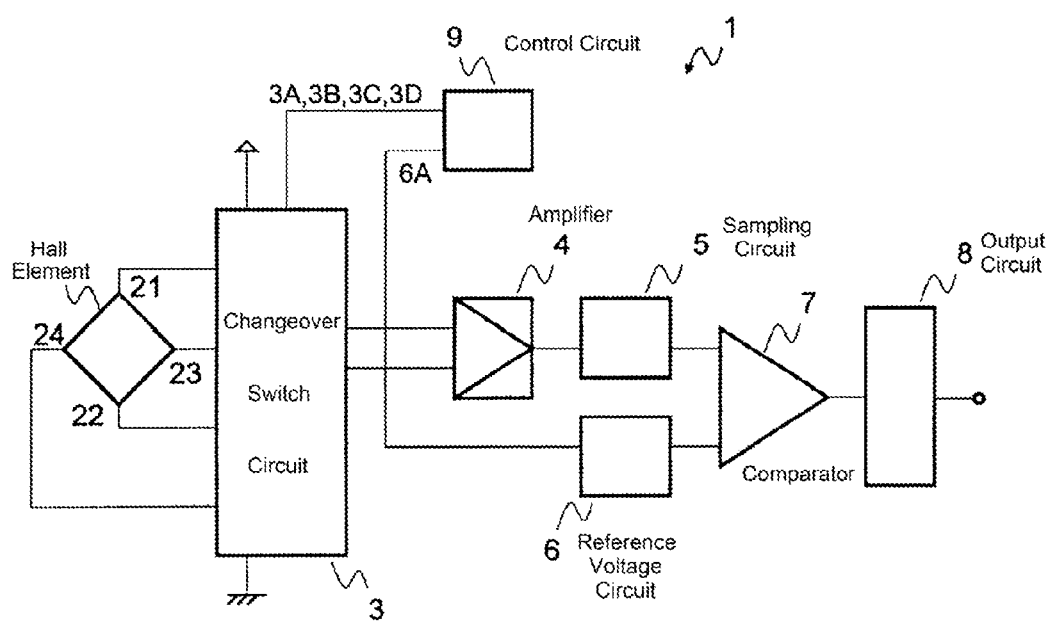
FIG. 1 is a block diagram of a magnetic sensor according to an embodiment of the present invention.

FIG. 1 is a block diagram of a magnetic sensor according to the embodiment of the present invention.

A magnetic sensor 1 according to the embodiment of the present invention includes a Hall element 2, a changeover switch circuit 3, an amplifier 4, a sampling circuit 5, a reference voltage circuit 6, a comparator 7, an output circuit 8, and a control circuit 9.

Via the changeover switch circuit 3, a current is supplied from a power source terminal to one terminal pair (for example, terminal 21 and terminal 22) on a diagonal line of the Hall element 2, and a differential signal voltage is output from both ends of the other terminal pair thereof (for example, terminal 23 and terminal 24). A differential signal voltage of the Hall element 2 is input to the amplifier 4 via the changeover switch circuit 3. The changeover switch circuit 3 is controlled by control signals 3A to 3D output from the control circuit 9, and switches between a first period and a second period of control of the Hall element 2. The amplifier 4 amplifies the differential signal voltage of the Hall element 2, and outputs a differential signal amplified voltage. The reference voltage circuit 6 outputs a reference voltage in accordance with a control signal 6A of the control circuit 9. The sampling circuit 5 holds differential signal amplified voltages of the first period and the second period, and outputs an average voltage thereof. The comparator 7 compares a magnitude relation between the average voltage and the reference voltage, and outputs a logic signal. The control circuit 9 outputs respective control signals to the changeover switch circuit 3, the amplifier 4, and the reference voltage circuit 6. The output circuit 8 performs a latch operation and a logical operation based on the logic signal, and outputs a detection signal as a detection signal of the magnetic sensor.

Figure 2:
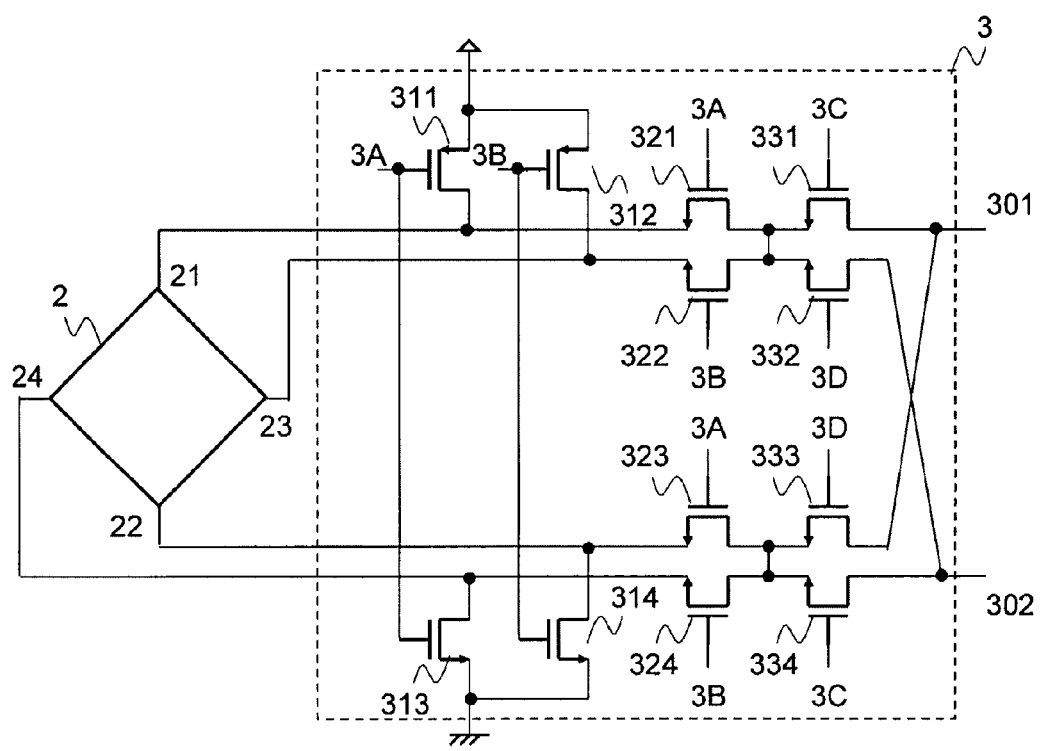
FIG. 2 is a detailed circuit diagram of a changeover switch circuit of the magnetic sensor according to the embodiment of the present invention.

FIG. 2 is a detailed circuit diagram of the changeover switch circuit 3 of the magnetic sensor according to the embodiment of the present invention.

The changeover switch circuit 3 includes first to fourth current supply switches 311 to 314, first to fourth series-transmission switches 321 to 324, and first to fourth cross-transmission switches 331 to 334. The control signals 3A to 3D are output from the control circuit 9. Terminals 301 and 302 are first and second differential signal voltage output terminals. In this case, a period during which the control signals 3A and 3B applied to the first to fourth current supply switches 311 to 314 are respectively "L" and "H", that is, a period during which a current is supplied to the terminal 21 and the terminal 22 of the Hall element 2, is set as the first period, and a period during which the control signals 3A and 3B are respectively "H" and "L", that is, a period during which a current is supplied to the terminal 23 and the terminal 24 of the Hall element 2, is set as the second period. The first to fourth series-transmission switches 321 to 324 are switched in association with the first to fourth current supply switches 311 to 314. The first to fourth cross-transmission switches 331 to 334 are controlled by the control signals 3C and 3D.

Figure 3:
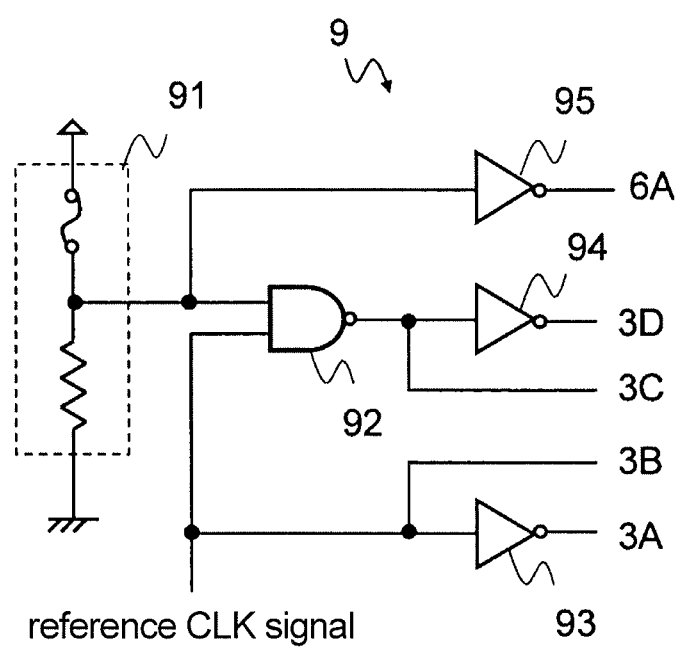
FIG. 3 is a circuit diagram illustrating one example of a control circuit of the magnetic sensor according to the embodiment of the present invention.
Figure 4:
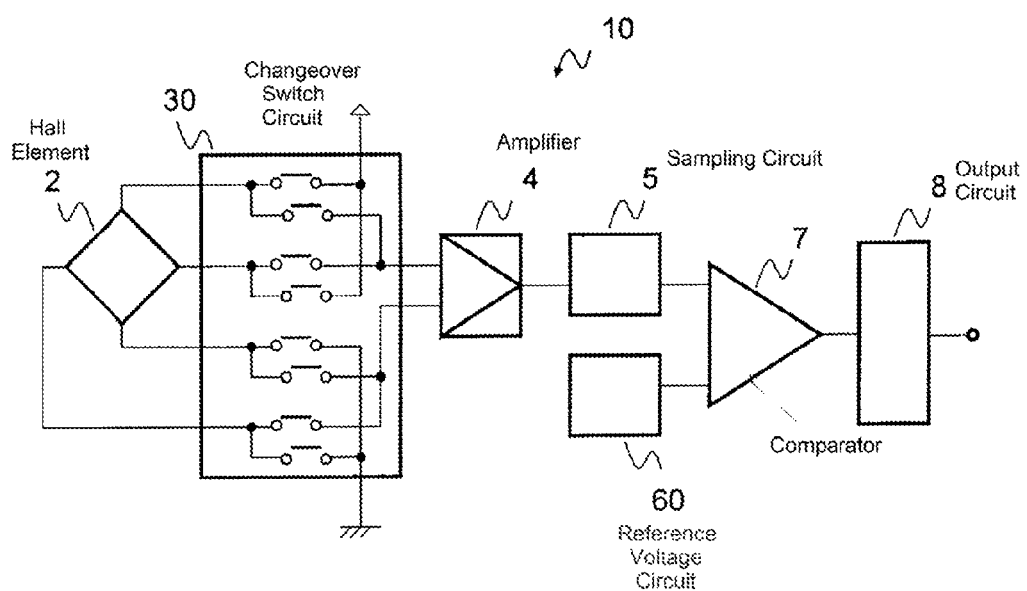
FIG. 4 is a block diagram of a conventional magnetic sensor.

FIG. 3 is a circuit diagram illustrating one example of the control circuit of the magnetic sensor according to the embodiment of the present invention. The control circuit 9 includes an operating state setting circuit 91, a NAND circuit 92, and OR circuits 93, 94, and 95. A reference CLK signal is input to the control circuit 9, and the control circuit 9 generates and outputs the control signals 3A, 3B, 3C, and 3D, and the control signal 6A. The operating state setting circuit 91 outputs a signal of "H" or "L", and includes a fuse and a pull-down resistor which are connected in series. For example, the operating state setting circuit 91 may include a non-volatile memory, or may include an external terminal and input a state setting signal from the exterior. Further, as long as a desired signal is generated, other logic circuits are not limited to the above-mentioned circuit configuration.

The above-mentioned magnetic sensor 1 operates as follows, and has a function of determining the magnitude of an offset voltage, and a function of determining the intensity of the magnetic field.

The magnetic sensor 1 according to the embodiment of the present invention has a first operating state and a second operating state depending on the control signals output from the control circuit 9. The operating state setting circuit 91 of the control circuit 9 outputs a signal of "H" in the initial state due to the fuse. Therefore, the NAND circuit 92 inverts the reference CLK signal and outputs the inverted signal. In other words, the control signal 3C is a signal obtained by inverting the reference CLK signal, and the control signal 3D is the same signal as the reference CLK signal. This state is the first operating state. The operating state setting circuit 91 of the control circuit 9 outputs a signal of "L" due to the pull-down resistor when the fuse is blown. Therefore, output of the NAND circuit 92 is fixed to "H". In other words, the control signals 3C and 3D are respectively fixed to "H" and "L". This state is the second operating state. In both operating states, the control signal 3A is the signal obtained by inverting the reference CLK signal, and the control signal 3B is the same signal as the reference CLK signal.

Description is given first of the first operating state. In the first operating state, the magnitude of the offset voltage of the magnetic sensor 1 is determined.

In the first operating state, the control circuit 9 outputs the control signals 3A and 3C of the signals obtained by inverting the reference CLK signal and the control signals 3B and 3D of the same signals as the reference CLK signal. During the first period, the first and fourth current supply switches 311 and 314 are electrically conductive, a current is supplied to the terminal pair of the terminal 21 and the terminal 22 of the Hall element 2, and the differential signal voltage is output from the terminal pair of the terminal 23 and the terminal 24 thereof. During the second period, the second and third current supply switches 312 and 313 are electrically conductive, a current is supplied to the terminal pair of the terminal 23 and the terminal 24, and the differential signal voltage is output from the terminal pair of the terminal 21 and the terminal 22. During the first period, the second cross-transmission switch 332 and the third cross-transmission switch 333 are electrically conductive, and, during the second period, the first cross-transmission switch 331 and the fourth cross-transmission switch 334 are electrically conductive.

Therefore, during the first period, the first differential signal voltage output terminal 301 is connected to the terminal 24 of the Hall element 2, and the second differential signal voltage output terminal 302 is connected to the terminal 23 of the Hall element 2. During the second period, the first differential signal voltage output terminal 301 is connected to the terminal 21 of the Hall element 2, and the second differential signal voltage output terminal 302 is connected to the terminal 22 of the Hall element 2. The output voltages of the first and second differential signal voltage output terminals 301 and 302 are amplified by the amplifier 4, and the amplified voltage is output.

Accordingly, when a differential signal amplified voltage output from the amplifier 4 during the first period is set as $Vo1\Phi1$ and a differential signal amplified voltage output from the amplifier 4 during the second period is set as $Vo1\Phi2$, $Vo1\Phi1$ and $Vo1\Phi2$ are respectively obtained from Equations 1 and 2.

$$Vo1\Phi1 = VDD/2 + G(KH \times Bin + Vos) \quad (1)$$

$$Vo1\Phi2 = VDD/2 + G(-KH \times Bin + Vos) \quad (2)$$

where VDD represents a power source voltage, G represents a gain of the amplifier 4, KH represents a magneto-electric conversion coefficient of the Hall element 2, Bin represents a magnetic flux density, and Vos represents an offset voltage included in the output voltage of the amplifier 4.

Therefore, an average voltage Vo1, which is obtained by averaging the differential signal amplified voltages $Vo1\Phi1$ and $Vo1\Phi2$ by the sampling circuit 5, is obtained from Equation 3.

$$Vo1 = VDD/2 + G \times Vos \quad (3)$$

At that time, in the reference voltage circuit 6, the reference voltage to be output is switched by the control signal 6A to a reference voltage Vref2 for determining the offset voltage. Accordingly, the comparator 7 compares the average voltage Vo1 and the reference voltage Vref2 to determine the magnitude of the offset voltage Vos, and the output circuit 8 outputs the result of the determination.

In this way, in the first operating state, the magnitude of the offset voltage Vos of the magnetic sensor 1 is determined. Therefore, in the inspection process, an individual having a high offset voltage Vos, which is a defect in the circuit of the magnetic sensor 1, is sorted out without increasing the circuit scale or using an additional inspection tool.

The amplifier 4 may be switched by the control signal of the control circuit 9 to have a gain for determining the offset voltage. By appropriately adjusting the reference voltage of the reference voltage circuit 6 and the gain of the amplifier 4, the detection operation of the offset voltage may be optimized.

Description is given next of the second operating state. The second operating state is a normal operating state, in which the intensity of magnetism is determined.

In the second operating state, the control signals 3C and 3D are respectively fixed to "H" and "L", and hence the first cross-transmission switch 331 and the fourth cross-transmission switch 334 are fixed to be electrically conductive. During the first period, the first and fourth current supply switches 311 and 314 are electrically conductive, a current is supplied to the terminal pair of the terminal 21 and the terminal 22 of the Hall element 2, and the differential signal voltage is output from the terminal pair of the terminal 23 and the terminal 24 thereof During the second period, the second and third current supply switches 312 and 313 are electrically conductive, a current is supplied to the terminal pair of the terminal 23 and the terminal 24, and the differential signal voltage is output from the terminal pair of the terminal 21 and the terminal 22. Therefore, during the first period, the first differential signal voltage output terminal 301 is connected to the terminal 23 of the Hall element 2, and the second differential signal voltage output terminal 302 is connected to the terminal 24 of the Hall element 2. During the second period, the first differential signal voltage output terminal 301 is connected to the terminal 21 of the Hall element 2, and the second differential signal voltage output terminal 302 is connected to the terminal 22 of the Hall element 2. The output voltages of the first and second differential signal voltage output terminals 301 and 302 are amplified by the amplifier 4, and the amplified voltage is output.

When a differential signal amplified voltage output from the amplifier 4 during the first period is set as Vo2Φ1 and a differential signal amplified voltage output from the amplifier 4 during the second period is set as Vo2Φ2, Vo2Φ1 and Vo2Φ2 are respectively obtained by Equations 4 and 5.

$$Vo2\Phi 1 = VDD/2 + G \times (KH \times Bin + Vos) \quad (4)$$

$$Vo2\Phi 2 = VDD/2 + G \times (KH \times Bin - Vos) \quad (5)$$

Therefore, an average voltage Vo2, which is obtained by averaging the differential signal amplified voltages Vo2Φ1 and Vo2Φ2 by the sampling circuit 5, is obtained from Equation 6.

$$Vo2 = VDD/2 + G \times KH \times Bin \quad (6)$$

From Equation 6, it is understood that the offset voltage Vos is cancelled in the average voltage Vo2. The comparator 7 compares the average voltage Vo2 obtained from Equation 6 and the reference voltage Vref, and determines the intensity of the magnetic field, thereby outputting the detection signal corresponding to the magnetic field. At that time, the reference voltage circuit 6 is switched to output the normal reference voltage Vref.

As described above, in the first operating state, the magnetic sensor according to the embodiment of the present invention evaluates the voltage based on the offset voltages of the Hall element and an amplifier circuit. Therefore, there is identified by binary decision an individual having a high offset voltage liable to generate a magnetic characteristics defect, which is to be an initial defective product. In other words, an individual having a high offset voltage is removed in the inspection process, and hence a high-precision magnetic sensor is provided.

In the case of a configuration in which the control circuit 9 inputs a control signal from the exterior, the control signal is input from the exterior, to thereby inspect a product even after product shipment. Therefore, an individual having a higher offset voltage due to change over time is identified.

What is claimed is:

1. A magnetic sensor, comprising:
   a Hall element;
   a changeover switch circuit which causes a current to flow into a first terminal pair of the Hall element and inputs a first differential signal voltage from a second terminal pair of the Hall element during a first period, and which causes a current to flow into the second terminal pair and inputs a second differential signal voltage from the first terminal pair during a second period;
   an amplifier which outputs a first differential signal amplified voltage and a second differential signal amplified voltage, the first differential signal amplified voltage and the second differential signal amplified voltage being respectively obtained by amplifying the first differential signal voltage and the second differential signal voltage which are input via the changeover switch circuit;
   a sampling circuit which holds the first differential signal amplified voltage and the second differential signal amplified voltage input from the amplifier, and which outputs an average voltage of the first differential signal amplified voltage and the second differential signal amplified voltage;
   a reference voltage circuit which generates a reference voltage;
   a comparator which compares the average voltage output from the sampling circuit and the reference voltage output from the reference voltage circuit; and
   a control circuit which outputs a control signal to control the changeover switch circuit;
   wherein the changeover switch circuit comprises series-transmission switches and cross-transmission switches, the series-transmission switches and the cross-transmission switches being provided in series between input terminals connected to terminals of the Hall element and output terminals of the changeover switch circuit;
   wherein the cross-transmission switch is controlled to cross-transmit a signal in any one of the first period and the second period in a first operating state;
   the cross-transmission switch is controlled not to cross-transmit a signal in any one of the first period and the second period in a second operating state; and
   a magnitude of an offset voltage included in the average voltage is determined in the first operating state.

2. A magnetic sensor according to claim 1, wherein the control circuit comprises a fuse, and switches between the first operating state and the second operating state depending on presence and absence of the fuse.

3. A magnetic sensor according to claim 1, wherein the control circuit comprises a non-volatile memory, and switches between the first operating state and the second operating state depending on data of the non-volatile memory.

4. A magnetic sensor according to claim 1, wherein the control circuit comprises a state setting terminal, and switches between the first operating state and the second operating state depending on a signal input to the state setting terminal.

* * * * *